(12) United States Patent
Nishimura

(10) Patent No.: US 8,570,313 B2
(45) Date of Patent: Oct. 29, 2013

(54) DISPLAY PANEL DRIVER

(75) Inventor: Kouichi Nishimura, Kanagawa (JP)

(73) Assignee: Renesas Electronics Corporation, Kawasaki, Kanagawa (JP)

( * ) Notice: Subject to any disclaimer, the term of this patent is extended or adjusted under 35 U.S.C. 154(b) by 828 days.

(21) Appl. No.: 12/662,627

(22) Filed: Apr. 26, 2010

(65) Prior Publication Data

US 2010/0271364 A1    Oct. 28, 2010

(30) Foreign Application Priority Data

Apr. 27, 2009  (JP) .................................. 2009-108404

(51) Int. Cl.
*G06F 3/038* (2013.01)

(52) U.S. Cl.
USPC ......................................................... 345/212

(58) Field of Classification Search
USPC .......... 345/204, 209, 211, 212; 330/207, 292, 330/298; 349/40
See application file for complete search history.

(56) References Cited

U.S. PATENT DOCUMENTS

| | | | |
|---|---|---|---|
| 6,433,407 B2 | 8/2002 | Gotoh et al. | |
| 2001/0050411 A1* | 12/2001 | Gotoh et al. | 257/545 |
| 2002/0067207 A1* | 6/2002 | Kato | 330/255 |
| 2010/0182296 A1* | 7/2010 | Yaguma et al. | 345/209 |
| 2010/0214277 A1* | 8/2010 | Yamazaki et al. | 345/211 |

FOREIGN PATENT DOCUMENTS

| | | |
|---|---|---|
| JP | 2000-260948 A | 9/2000 |
| JP | 2001-358300 A | 12/2001 |
| JP | 2002-175052 A | 6/2002 |
| JP | 2003-308050 A | 10/2003 |

OTHER PUBLICATIONS

Japanese Office Action with English translation dated Feb. 22, 2013.
Chinese Office Action dated Aug. 7, 2013 with partial English translation thereof.

* cited by examiner

*Primary Examiner* — Yong H Sim
(74) *Attorney, Agent, or Firm* — McGinn IP Law Group, PLLC

(57) ABSTRACT

A display panel driver is provided with: first and second amplifiers; first to n-th even output nodes, n being an integer of two or more; first to n-th odd output nodes; first and second output pads connected to data lines of a display panel, respectively; first to n-th switch blocks; first to n-th even electrostatic protection resistors; and first to n-th odd electrostatic protection resistors. The i-th switch block out of the first to n-th switch blocks is configured to switch connections between the first and second amplifiers and i-th even and odd electrostatic protection resistors out of the first to n-th even and odd electrostatic protection resistors. The first to n-th even electrostatic protection resistors are connected between the first to n-th even output nodes and the first output pad, respectively. The first to n-th odd electrostatic protection resistors are connected between the first to n-th odd output nodes and the second output pad, respectively.

4 Claims, 11 Drawing Sheets

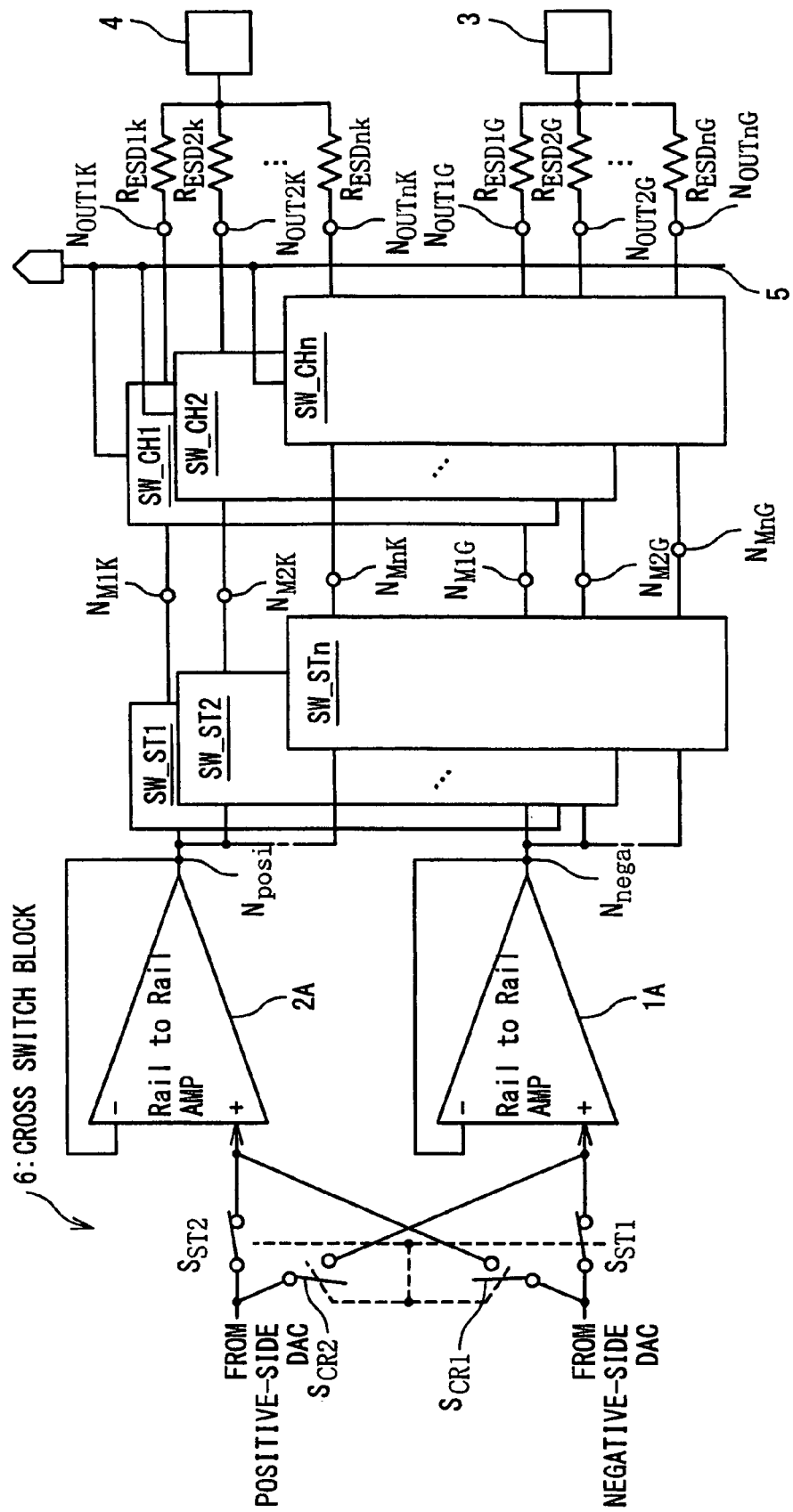

DISPLAY PANEL DRIVER

INCORPORATION BY REFERENCE

This application claims the benefit of priority based on Japanese Patent Application No. 2009-108404, filed on Apr. 27, 2009, the disclosure of which is incorporated herein by reference.

BACKGROUND OF THE INVENTION

1. Field of the Invention

The present invention relates to a display panel driver, and more particularly, to a technique for reducing the influence of an electrostatic protection resistor, which is connected to a pad, in an output circuit of a display panel driver.

2. Description of the Related Art

When a display panel driver, such as an LCD (liquid crystal display) driver, is implemented as an integrated circuit, an electrostatic protection resistor is typically inserted in series between an output stage of an output circuit and a pad. This is because the elimination of the series-connected electrostatic protection resistor may require a special measure, including an undesired increase in the transistor size of the output stage and use of an electrostatic protection element as an output transistor. Such special measure, however, may cause various problems, including undesired increases in the parasitic capacitance and the chip size, difficulty in achieving of desired characteristics.

When an electrostatic protection resistor is inserted in series between the output stage of the output circuit and the pad, the resistance value of the electrostatic protection resistor is set within a range that meets a certain standard determined to protect internal transistors from static electricity. The electrostatic protection resistor is typically set to a resistance value within the range of several tens to several hundreds ohms ($\Omega$). If the resistance value is smaller than the range, the electrostatic protection standard determined in the MIL standard (Military Standard) or EIAJ (Electronic Industries Association of Japan) standard cannot be met.

The connection of the electrostatic protection resistor to the output circuit of the display panel driver, however, undesirably deteriorates the output characteristics of the output circuit. In the following, we discuss the deterioration of the output characteristics caused by the connection of the electrostatic protection resistor to the output circuit.

FIG. 1 is a circuit diagram illustrating an example of an output circuit of an LCD driver using analog amplifier circuits. FIG. 1 illustrates only a part corresponding to two output pads of the output circuit. The output circuit of the LCD driver in FIG. 1 is provided with a negative-side amplifier 101, a positive-side amplifier 102, an even output pad 103, an odd output pad 104, a common line 105, electrostatic protection resistors $R_{ESD1}$ and $R_{ESD2}$, and switches $S_1$ to $S_7$. The negative- and positive-side amplifiers 101 and 102 are both voltage-follower connected, of which non-inverting input terminals are connected to positive- and negative-side D/A converters (Digital to Analog converters).

The switch $S_1$ is connected between an even output node $N_{OUT1}$ and an output of the negative-side amplifier 101, and the switch $S_2$ is connected between an odd output node $N_{OUT2}$ and an output of the positive-side amplifier 102. The switch $S_3$ is connected between the odd output node $N_{OUT2}$ and the output of the negative-side amplifier 101, and the switch $S_4$ is connected between the even output node $N_{OUT1}$ and the output of the positive-side amplifier 102. The switches $S_1$ to $S_4$ are operated in conjunction with one another. The switch $S_5$ is connected between the even output node $N_{OUT1}$ and the odd output node $N_{OUT2}$; the switch $S_6$ is connected between the odd output node $N_{OUT2}$ and the common line 105; and the switch $S_7$ is connected between the even node $N_{OUT1}$ and the common line 105. The switches $S_5$ to $S_7$ are operated in conjunction with one another.

On the other hand, the electrostatic protection resistor $R_{ESD1}$ is connected between the even output node $N_{OUT1}$ and the even output pad 103, and the electrostatic protection resistor $R_{ESD2}$ is connected between the odd output node $N_{OUT2}$ and the odd output pad 104. It should be noted that, although it is general in practice to use electrostatic protection diodes and the like in addition to the electrostatic protection resistors $R_{ESD1}$ and $R_{ESD2}$ for electrostatic protection, the electrostatic protection diodes in the circuit diagram are not shown and no description thereof is given; the electrostatic protection diodes and the like are not directly related to the present invention.

Although effectively avoiding electrostatic breakdown, the electrostatic protection resistors $R_{ESD1}$ and $R_{ESD2}$ undesirably deteriorate the waveforms of the output signals. Illustrated in FIG. 2 is an output waveform for a case where a rectangular wave is inputted to an input terminal, which is plotted for various resistance values of the electrostatic protection resistor. As is understood from FIG. 2, the output waveform is undesirably rounded as the resistance value of the electrostatic protection resistor is increased. Although ideal characteristics are obtained when the resistance value of the electrostatic protection resistor is zero, the electrostatic resistor having a non-zero resistance value should be inserted in practice, and therefore the characteristics are limited depending on the resistance value.

On the other hand, a circuit configuration for reducing the influence of the electrostatic protection resistor on an output circuit of a digital circuit is disclosed in, for example, Japanese Patent Application Publication JP 2001-358300A. In the following, a description is given of the output circuit disclosed in this patent application with reference to FIG. 3. The output circuit shown in FIG. 3 is provided with n PMOS transistors $MP_1$ to $MP_n$, n NMOS transistors $MN_1$ to $MN_n$, PMOS electrostatic protection resistors $R_{P1}$ to $R_{Pn}$, NMOS electrostatic protection resistors $R_{N1}$ to $R_{Nn}$, an internal circuit 106, an output terminal pad 107, and an inverter 108. The sources of the PMOS transistors $MP_1$ to $MP_n$ are commonly connected to a power supply line of the positive power supply voltage ($V_{DD}$), and the sources of the NMOS transistors $MN_1$ to $MN_n$ are commonly connected to a power supply line of the negative power supply voltage ($V_{SS}$). The inverter 108 has an input connected to the output terminal pad 107 and an output connected to the internal circuit 106. The gates of the PMOS transistors $MP_1$ to $MP_n$ and the NMOS transistors $MN_1$ to $MN_n$ are commonly connected to the output of the internal circuit 106. Also, the PMOS electrostatic protection resistors $R_{P1}$ to $R_{Pn}$ are connected between the drains of the PMOS transistors $MP_1$ to $MP_n$ and the output terminal pad 107, and the NMOS electrostatic protection resistors $R_{N1}$ to $R_{Nn}$ are connected between the drains of the NMOS transistors $MN_1$ to $MN_n$ and the output terminal pad 107.

Referring to FIG. 3, the PMOS and NMOS electrostatic protection resistors $R_{P1}$ to $R_{Pn}$ and $R_{N1}$ to $R_{Nn}$ are used to prevent the MOS transistors from being broken by an electrostatic surge, and the resistance values of the resistors are typically around several tens to several hundreds ohms, depending on the device manufacture process. Actual resistance values of the electrostatic protection resistors $R_{P1}$ to $R_{Pn}$ and $R_{N1}$ to $R_{Nn}$, which vary depending on the actual accuracy of each device process, should be adjusted to resistance values which meet the standard. As described above, the voltage drop across the electrostatic protection resistor may cause deterioration in the characteristics of the output circuit; however, as illustrated in FIG. 3, the use of parallel-connected MOS transistors allows distributing flowing currents to the n electrostatic protection resistors. That is, the current through each electrostatic protection resistor is reduced down to 1/n of the original current. This also reduces the voltage drop caused by the current through each electrostatic protection resistor to 1/n, consequently avoiding the deterioration in the characteristics of the output circuit.

As described above, it is known that the output characteristics are improved as the resistance value of the electrostatic protection resistor is decreased. Accordingly, one potential approach based on the same idea as that underlying the circuit illustrated in FIG. 3 may be the use of multiple signal outputs to decrease the effective resistance value of each electrostatic protection resistor. However, the circuit in FIG. 3 is merely one example of the application to the output circuit in the digital circuit, and therefore the conventional technique cannot be directly applied to the example where the switch circuit is inserted into the output as in the output circuit of the display panel driver as illustrated in FIG. 1. This is because a transistor switch circuit and a CMOS logic circuit are completely different in nature. A switch may consist of a single N-channel MOS transistor, a single P-channel MOS transistor, or a transfer gate circuit, which is provided with paired NMOS and PMOS transistors. Since the output circuit of the display panel driver is different in nature from the circuit shown in FIG. 3, the optimum approach may be different from that for the conventional circuit shown in FIG. 3. That is, one issue is that the conventional approach cannot be simply applied to the output circuit of the display panel driver.

SUMMARY OF INVENTION

A basic concept of the present invention is that a plurality of paths are provided between an amplifier and an output pad in an output circuit of a display panel driver, each path being including an electrostatic protection resistor. This reduces the effective output resistance, thereby suppressing the deterioration of the output signal waveform.

In an aspect of the present invention, a display panel driver is provided with: first and second amplifiers; first to n-th even output nodes, n being an integer of two or more; first to n-th odd output nodes; first and second output pads connected to data lines of a display panel, respectively; first to n-th switch blocks; first to n-th even electrostatic protection resistors; and first to n-th odd electrostatic protection resistors. The i-th switch block out of the first to n-th switch blocks is configured to switch connections between the first and second amplifiers and i-th even and odd electrostatic protection resistors out of the first to n-th even and odd electrostatic protection resistors. The first to n-th even electrostatic protection resistors are connected between the first to n-th even output nodes and the first output pad, respectively. The first to n-th odd electrostatic protection resistors are connected between the first to n-th odd output nodes and the second output pad, respectively.

The present invention provides a display panel driver including an output circuit which improves output characteristics while providing a necessary electrostatic protection resistance value.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 7A is a circuit diagram illustrating an exemplary configuration of an output circuit of an LCD driver in a third embodiment of the present invention;

DESCRIPTION OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

First Embodiment

Figure 4:
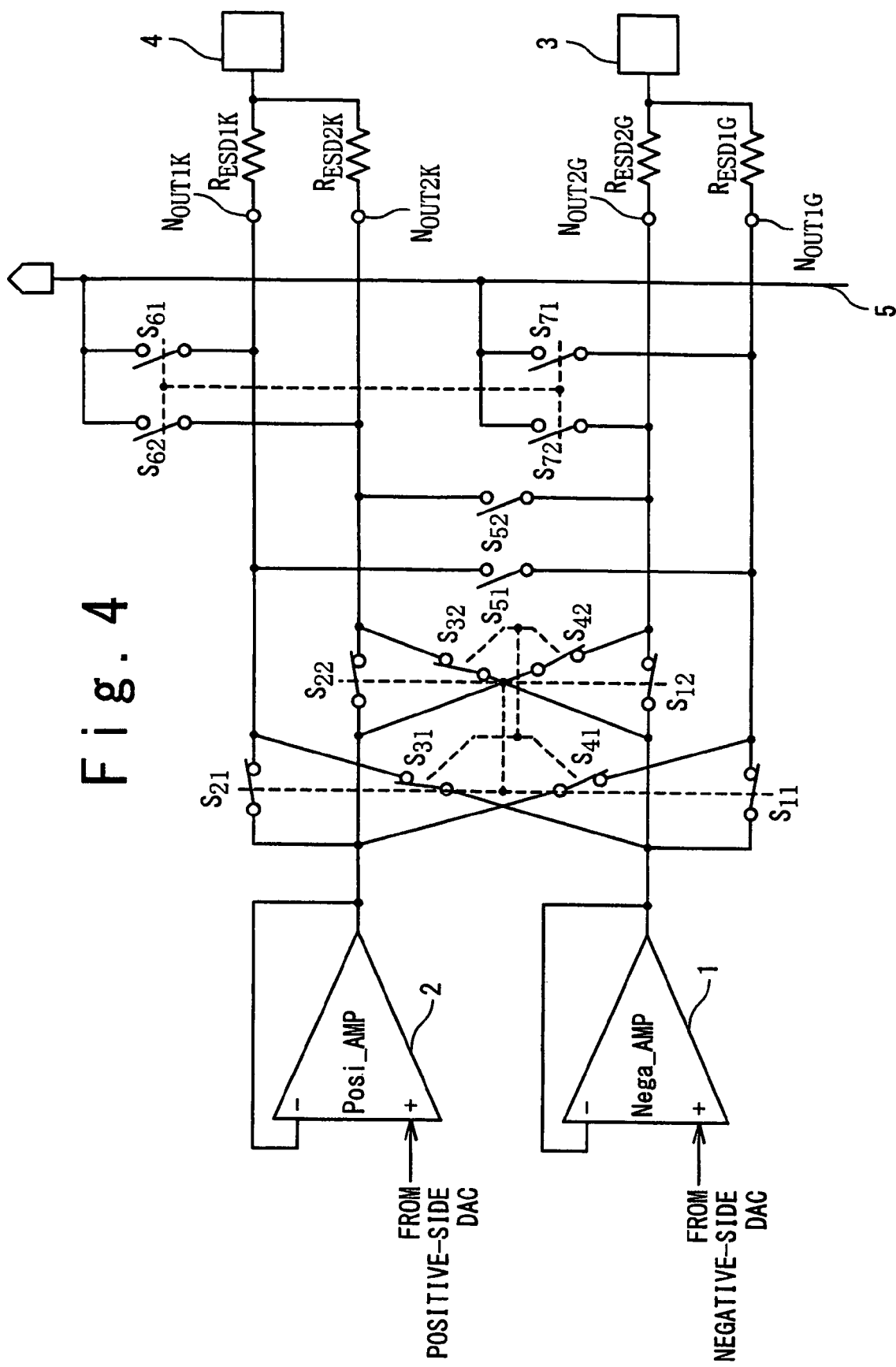
FIG. 4 is a circuit diagram illustrating an exemplary configuration of an output circuit of an LCD driver in a first embodiment of the present invention.

FIG. 4 is a circuit diagram illustrating an exemplary configuration of an output circuit of an LCD driver in a first embodiment of the present invention. The output circuit of the first embodiment is provided with a negative-side amplifier 1, a positive-side amplifier 2, an even output pad 3, an odd output pad 4, and electrostatic protection resistors $R_{ESD1G}$, $R_{ESD2G}$, $R_{ESD1K}$, and $R_{ESD2K}$. The even pad 3 and the odd output pad 4 are connected to corresponding data lines of an LCD panel. The negative-side amplifier 1 generates a "negative" drive voltage, and the positive-side amplifier 2 generates a "positive" drive voltage. It should be noted that, in the present specification, the term "positive" means that the voltage is higher than the common voltage fed to the opposite electrode of the LCD panel, whereas the "negative" means that the voltage is lower than the common voltage.

The non-inverting input terminals of the negative-side amplifier 1 and positive-side amplifier 2 are connected to a negative side D/A converter (Digital to Analog Converter) and a positive side D/A converter, respectively. The negative-side D/A converter supplies a "negative" grayscale voltage to the non-inverting input terminal of the negative-side amplifier 1 in response to corresponding image data fed to the LCD driver, and the positive side D/A converter supplies a "positive" grayscale voltage to the non-inverting input terminal of the positive-side amplifier 2 in response to corresponding image data. The negative-side amplifier 1 and the positive-side amplifier 2 are both voltage-follower connected, and output drive voltages substantially identical to the supplied grayscale voltages. The "negative" drive voltage generated by the negative-side amplifier 1 is supplied to one of the even output pad 3 and the odd output pad 4, and the "positive" drive voltage generated by the positive-side amplifier 2 is supplied to the other. Also, the electrostatic protection resistor $R_{ESD1G}$ is connected between an output node $N_{OUT1G}$ and the even output pad 3, and the electrostatic protection resistor $R_{ESD2G}$ is connected between an output node $N_{OUT2G}$ and the even output pad 3. Further, the electrostatic protection resistor $R_{ESD1K}$ is connected between an output node $N_{OUT1K}$ and the odd output pad 4, and the electrostatic protection resistor $R_{ESD2K}$ is connected between an output node $N_{OUT2K}$ and the odd output pad 4.

The output circuit of the first embodiment is further provided with fourteen switches: switches $S_{11}$ to $S_{71}$, and $S_{12}$ to $S_{72}$. The switches $S_{11}$ to $S_{41}$ are used to switch the connections between the outputs of the negative-side amplifier 1 and positive-side amplifier 2 and the output nodes $N_{OUT1G}$ and $N_{OUT1K}$. The switch $S_{11}$ is connected between the even output node $N_{OUT1G}$ and the output of the negative-side amplifier 1, and the switch $S_{21}$ is connected between the odd output node $N_{OUT1K}$ and the output of the positive-side amplifier 2. The switch $S_{31}$ is connected between the odd output node $N_{OUT1K}$ and the output of the negative-side amplifier 1, and the switch $S_{41}$ is connected between the even output node $N_{OUT1G}$ and the output of the positive-side amplifier 2. Similarly, the switches $S_{12}$ to $S_{42}$ constitute a switch group for switching a connection relationship between the outputs of the negative-side amplifier 1 and the positive-side amplifier 2 and the output nodes $N_{OUT2G}$ and $N_{OUT2K}$. The switch $S_{12}$ is connected between the even output node $N_{OUT2G}$ and the output of the negative-side amplifier 1, and the switch $S_{22}$ is connected between the odd output node $N_{OUT2K}$ and the output of the positive-side amplifier 2. The switch $S_{32}$ is connected between the odd output node $N_{OUT2K}$ and the output of the negative-side amplifier 1, and the switch $S_{42}$ is connected between the even output node $N_{OUT2G}$ and the output of the positive-side amplifier 2. The switches $S_{11}$ to $S_{41}$ and $S_{12}$ to $S_{42}$ enable the operation of inverting polarities of the drive voltages outputted from the even output pad 3 and the odd output pad 4.

The switches $S_{51}$, $S_{52}$, $S_{61}$, $S_{71}$, $S_{62}$, and $S_{72}$ are used as charge collecting switches. The switch $S_{51}$ is connected between the even output node $N_{OUT1G}$ and the odd output node $N_{OUT1K}$, and the switch $S_{52}$ is connected between the even output node $N_{OUT2G}$ and the odd output node $N_{OUT2K}$. The switch $S_{61}$ is connected between the odd output node $N_{OUT1K}$ and a common line 5, and the switch $S_{71}$ is connected between the even output node $N_{OUT1G}$ and the common line 5. Similarly, the switch $S_{62}$ is connected between the odd output node $N_{OUT2K}$ and the common line 5, and the switch $S_{72}$ is connected between the even output node $N_{OUT2G}$ and the common line 5.

Among the above-described switches, the switches $S_{11}$, $S_{21}$, $S_{12}$, and $S_{22}$ are operated in conjunction with one another. Also, the switches $S_{31}$, $S_{41}$, $S_{32}$, and $S_{42}$ are operated in conjunction with one another. Further, the switches $S_{51}$, $S_{52}$, $S_{61}$, $S_{62}$, $S_{71}$ and $S_{72}$ are operated in conjunction with one another.

Figure 1:
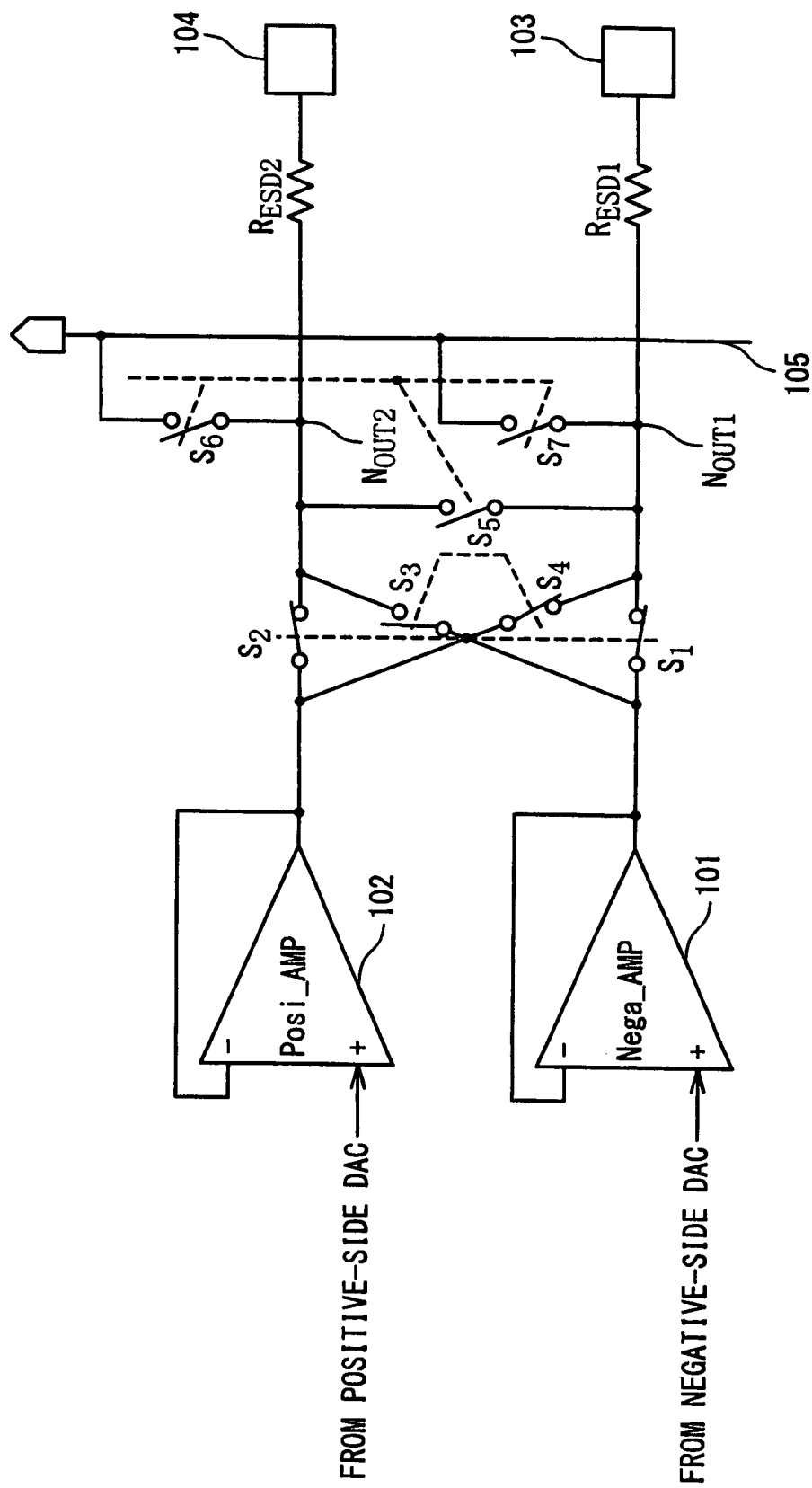
FIG. 1 is a circuit diagram illustrating the configuration of an output circuit of a conventional LCD driver.
Figure 2:
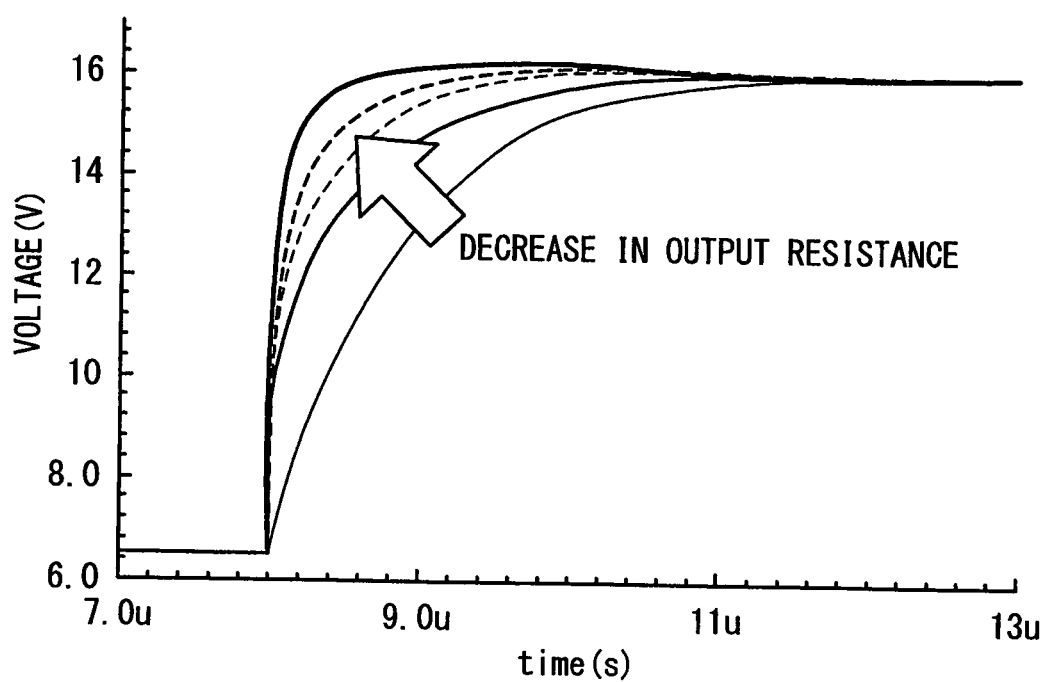
FIG. 2 is a graph illustrating the relationship between an output voltage waveform and a resistance value of an electrostatic protection resistor.
Figure 3:
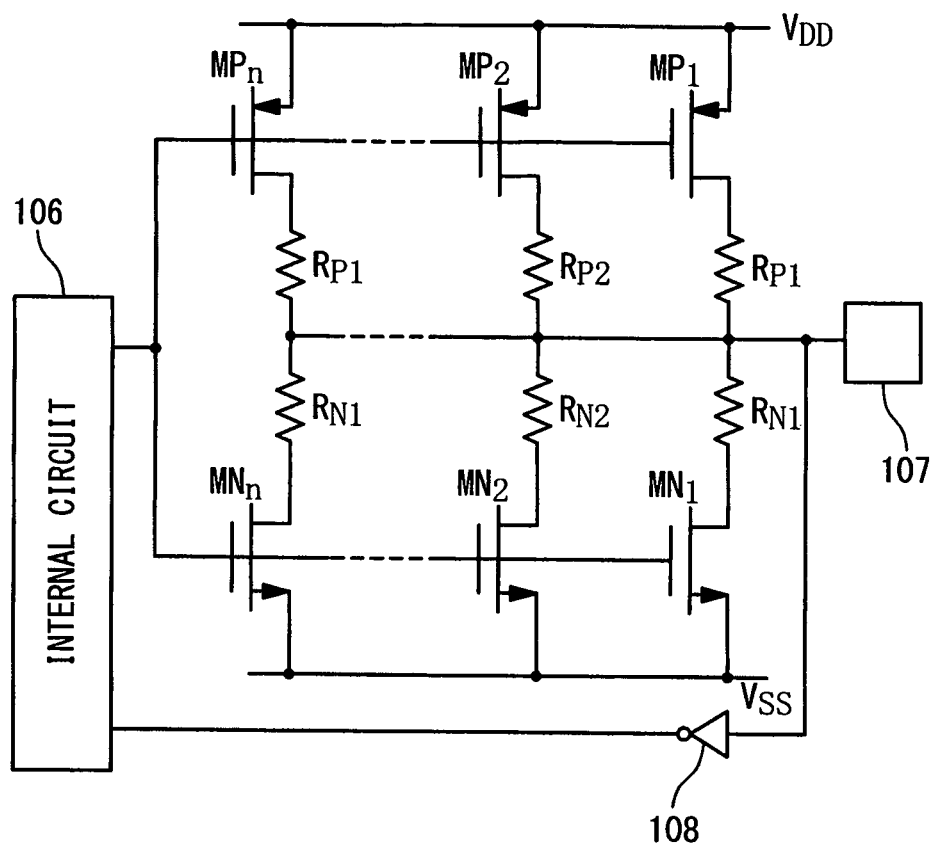
FIG. 3 is a circuit diagram illustrating the configuration of an output circuit in a conventional digital circuit.

In the following, a description is given of an exemplary operation of the output circuit of this embodiment with reference to FIG. 4. The operation of the output circuit of this embodiment is basically same as that of the conventional circuit illustrated in FIG. 2. The switches $S_{11}$ to $S_{41}$ and $S_{12}$ to $S_{42}$ are used to achieve polarity inverting functions. These switches provide a connection between one of the negative-side amplifier 1 and positive-side amplifier 2 and the even output pad 3, and a connection between the other to the odd output pad 4. The switches $S_{51}$, $S_{61}$, $S_{71}$, $S_{52}$, $S_{62}$ and $S_{72}$ function as the charge collecting switches.

The difference is that, in this embodiment, two paths are provided between the negative-side amplifier 1 and the output pad (the even output pad 3 or the odd output pad 4), and similarly, two paths are provided between the positive-side amplifier 2 and the output pad (the even output pad 3 or the odd output pad 4). In each path, an electrostatic protection resistor ($R_{ESD1G}$, $R_{ESD2G}$, $R_{ESD1K}$, or $R_{ESD2K}$) having a resistance value which meets the standard is inserted. This allows the current flowing through the even output pad 3 or the odd output pad 4 to be divided into the two paths. In the case where the electrostatic protection resistors $R_{ESD1G}$, $R_{ESD2G}$, $R_{ESD1K}$, and $R_{ESD2K}$ have the same the resistance value, the same currents flow through the electrostatic protection resistors $R_{ESD1G}$ and $R_{ESD2G}$, and the same currents flow through the electrostatic protection resistors $R_{ESD1K}$ and $R_{ESD2K}$. That is, halves of the current inputted/outputted to/from the pad are supplied through the above-described two paths. This results in that the current flowing through the electrostatic protection resistor $R_{ESD1G}$, $R_{ESD2G}$, $R_{ESD1K}$, or $R_{ESD2K}$ to be a half of the required output current, which effectively improves the output transient response waveform.

Figure 5:
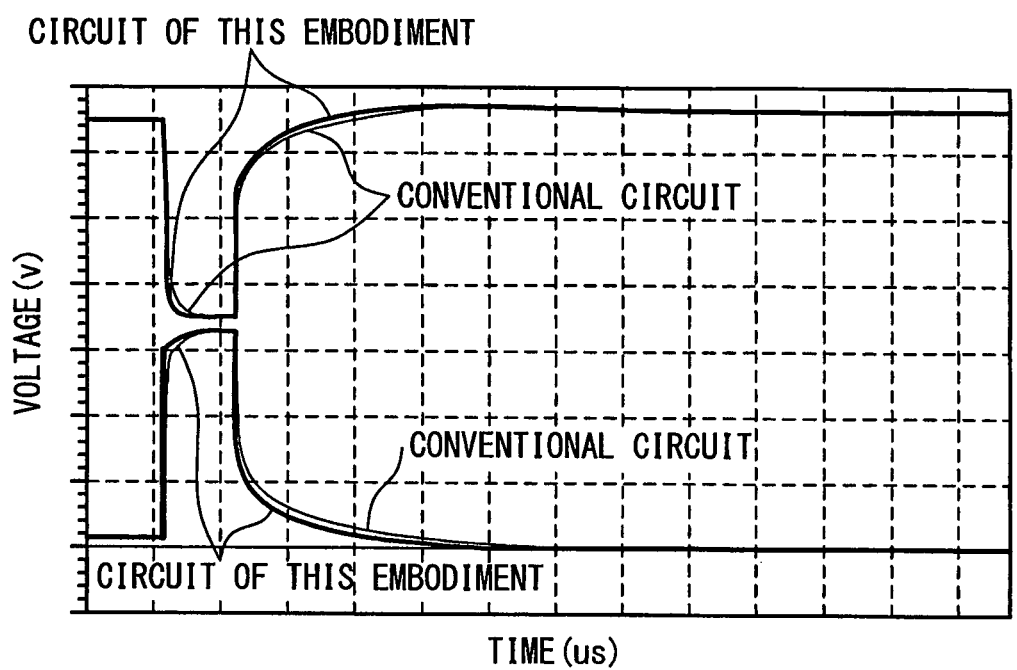
FIG. 5 is a graph comparing output characteristics between the output circuits based on the present invention and the conventional technique.

An exemplary result of the improvement is illustrated in FIG. 5. FIG. 5 is a graph in which voltage waveforms obtained by simulations of the circuits respectively based on the conventional technique illustrated in FIG. 5 and the present embodiment illustrated in FIG. 4 are superposed. The thick line indicates the waveform of the output voltage of the circuit based on this embodiment, and the thin line indicates the waveform of the output voltage of the circuit based on the conventional technique. The rising and falling edges of the waveforms, which depend on the slew rate, are not considerably different between the conventional technique and the present embodiment; however, as described above, the shape of the shoulder part of the waveform is determined by the output resistance value (the resistance value of the electrostatic protection resistor in this case) (see FIG. 2). As is understood from FIG. 5, the transient characteristics of the output are improved as compared with the conventional circuit. From the 10% and 90% values of the output amplitudes, we can confirm that the improvement effect of approximately 20% is obtained. Further, the time during which the waveform is concentrated in the center corresponds to the waveform during charge collection, and the charge collecting efficiency increases when the waveform is more concentrated in the center. From such a perspective that the waveform based on the present invention is concentrated in the center during the charge collecting period, it turns out that the charge collecting efficiency is increased as compared with the conventional circuit.

Second Embodiment

Figure 6A:
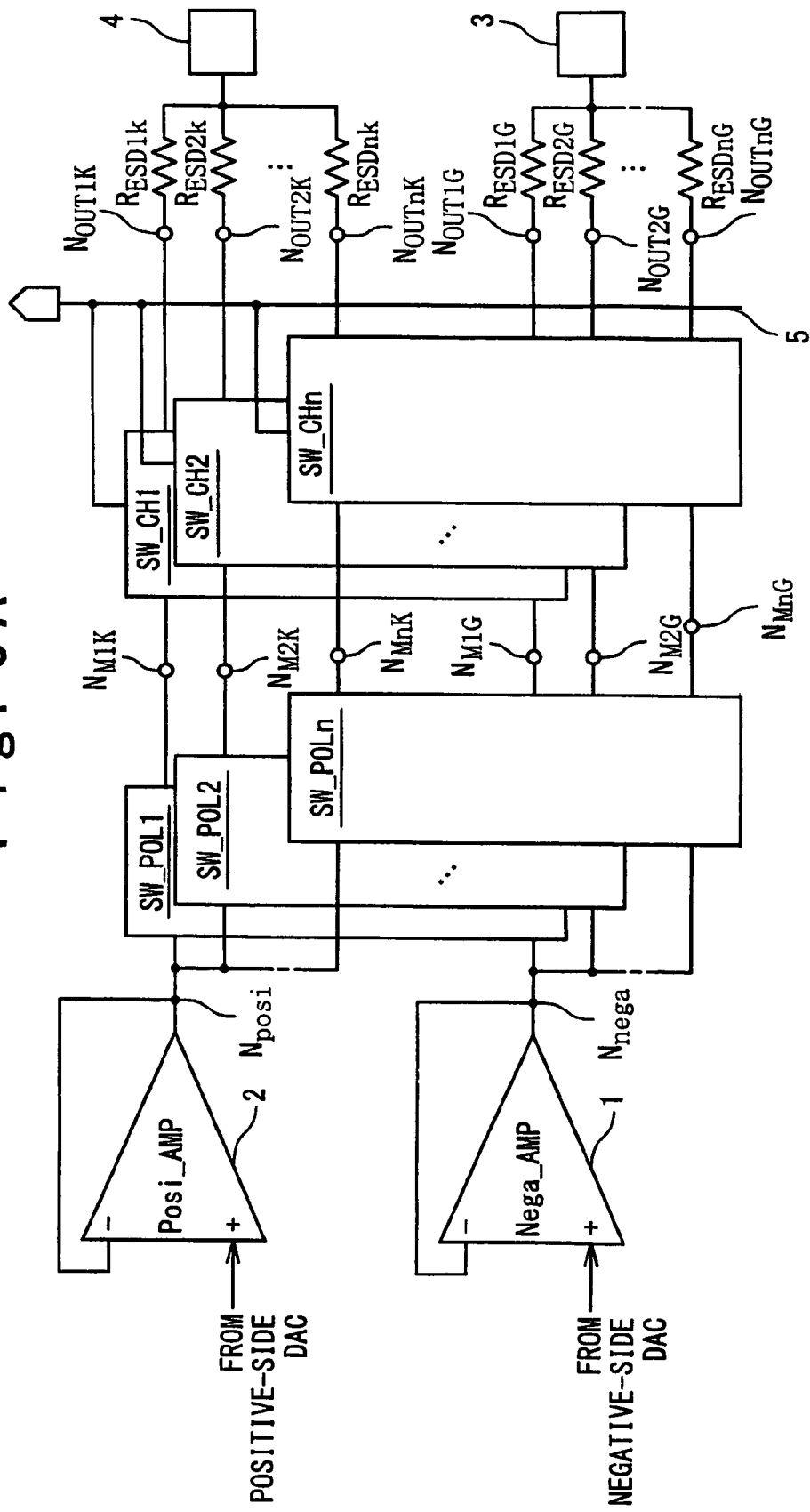
FIG. 6A is a circuit diagram illustrating an exemplary configuration of an output circuit of an LCD driver in a second embodiment of the present invention.

FIG. 6A is a block diagram illustrating an exemplary configuration of an output circuit in a second embodiment of the present invention. The circuit configuration shown in FIG. 6A is obtained by generalizing the circuit configuration of FIG. 4; in the output circuit of the second embodiment, n paths are provided between the negative-side amplifier 1 and an output pad (the even output pad 3 or the odd output pad 4), and n paths are also provided between the positive-side amplifier 2 and the output pad (the even output pad 3 or the odd output pad 4). The circuit configuration of FIG. 4 is an example where n is two in the circuit configuration of FIG. 6A.

Specifically, the output circuit of the second embodiment is provided with the negative-side amplifier 1, the positive-side amplifier 2, the even output pad 3, the odd output pad 4, and electrostatic protection resistors $R_{ESD1G}$ to $R_{ESDnG}$ and $R_{ESD1K}$ to $R_{ESDnK}$. The electrostatic protection resistors $R_{ESD1G}$ to $R_{ESDnG}$ are respectively connected between even output nodes $N_{OUT1G}$ to $N_{OUTnG}$ and the even output pad 3, and the electrostatic protection resistors $R_{ESD1K}$ to $R_{ESDnK}$ are respectively connected between odd output nodes $N_{OUT1K}$ to $N_{OUTnK}$ and the odd output pad 4.

The output circuit of the second embodiment is further provided with polarity switching switch blocks SW_POL1 to SW_POLn, and charge collecting switch blocks SW_CH1 to SW_CHn. The polarity switching switch blocks SW_POL1 to SW_POLn have functions of switching connections between the outputs of the negative-side amplifier 1 and positive-side amplifier 2 and the output nodes $N_{OUT1G}$ to $N_{OUTnG}$ and $N_{OUT1K}$ to $N_{OUTnK}$. On the other hand, the charge collecting switch blocks SW_CH1 to SW_CHn have functions of switching connections between the output nodes $N_{OUT1G}$ to $N_{OUTnG}$ and $N_{OUT1K}$ to $N_{OUTnK}$ and the common line 5. In addition, each of the charge collecting switch blocks SW_CHi has a function of achieving short-circuiting between the output node $N_{OUTiG}$ and the output node $N_{OUTiK}$.

Figure 6B:
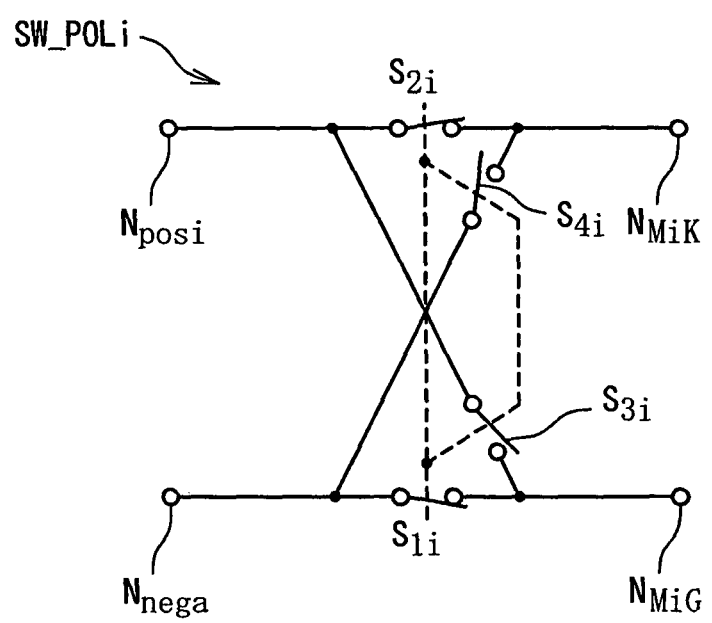
FIG. 6B is a circuit diagram illustrating an exemplary configuration of a polarity switching switch block in the second embodiment.

Each of the polarity switching switch blocks SW_POLi has a so-called cross switch configuration. That is, as illustrated in FIG. 6B, each of the polarity switching switch blocks SW_POLi is provided with switches $S_{1i}$ to $S_{4i}$. The switch $S_{1i}$ is connected between the output $N_{nega}$ of the negative-side amplifier 1 and an even intermediate node $N_{MiG}$, and the switch $S_{2i}$ is connected between the output $N_{posi}$ of the positive-side amplifier 2 and an odd intermediate node $N_{MiK}$. Also, the switch $S_{3i}$ is connected between the output $N_{posi}$ of the positive-side amplifier 2 and the even intermediate node $N_{MiG}$, and the switch $S_{4i}$ is connected between the output $N_{nega}$ of the negative-side amplifier 1 and the odd intermediate node $N_{MiK}$.

Figure 6C:
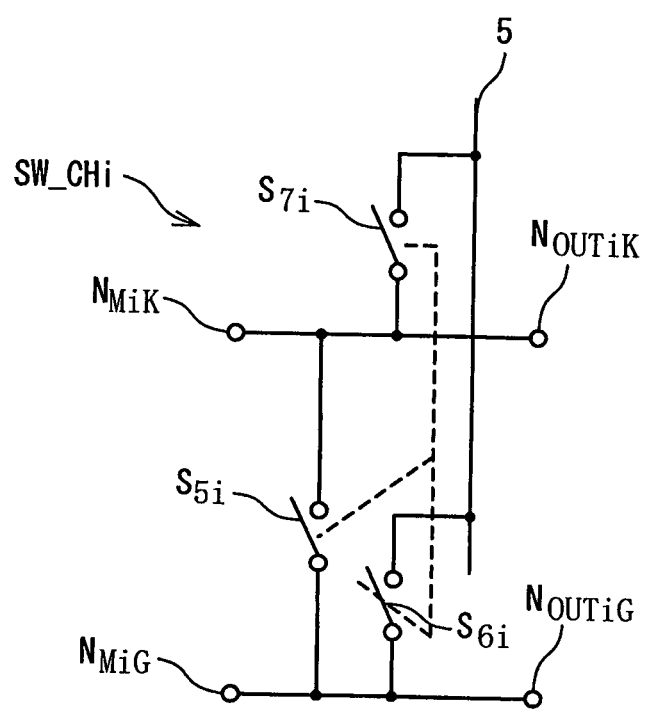
FIG. 6C is a circuit diagram illustrating an exemplary configuration of a charge collecting switch block in the second embodiment.

On the other hand, each of the charge collecting switch blocks SW_CHi is, as illustrated ion FIG. 6C, provided with switches $S_{5i}$ to $S_{7i}$. The switch $S_{5i}$ is connected between the odd output node $N_{OUTiK}$ and the even output node $N_{OUTiG}$. The switch $S_{6i}$ is connected between the even output node $N_{OUTiG}$ and the common line 5, and the switch $S_{7i}$ is connected between the odd output node $N_{OUTiK}$ and the common line 5. Note that, inside the charge collecting switch block SW_CHi, the odd intermediate note $N_{MiK}$ and the odd output node $N_{OUTiK}$ are directly connected to each other, and the even intermediate node $N_{MiG}$ and the even output node $N_{OUTiG}$ are directly connected to each other.

The switches included in the switches SW_POL1 to SW_POLn are all operated in conjunction with one another. Also, the switches included in the switches SW_CH1 to SW_CHn are all operated in conjunction with one another.

The operation of the circuit in FIG. 6A is basically the same as that of the circuit in FIG. 4. It should be noted that the effective electrostatic protection resistance value decreases as n is increased. That is, the output waveform becomes closer to an ideal one, since the output resistance value is decreased in FIG. 2.

Third Embodiment

FIG. 7A is a block diagram illustrating an exemplary configuration of an output circuit in a third embodiment of the present invention. In the circuit of FIG. 7A, the negative-side amplifier 1 and the positive-side amplifier 2 in the circuit of FIG. 6 are respectively replaced with amplifiers 1A and 2A which each provide a rail-to-rail operation. Along with this, a cross switch block 6 is inserted between the amplifiers 1A and 2A and positive- and negative-side D/A converters, and the polarity switching switch blocks SW_POL1 to SW_POLn are replaced with straight switch blocks SW_ST1 to SW_STn. The cross switch block 6 is provided with switches $S_{ST1}$, $S_{ST2}$, $S_{CR1}$, and $S_{CR2}$. The switch $S_{ST1}$ is connected between an output of the negative side D/A converter and the non-inverting input terminal of the amplifier 1A, and the switch $S_{ST2}$ is connected between an output of the positive side D/A converter and a non-inverting input terminal of the amplifier 2A. Also, the switch $S_{CR1}$ is connected between the output of the negative-side D/A converter and the non-inverting input terminal of the amplifier 2A, and the switch $S_{CR2}$ is connected between the output of the positive-side D/A converter and the non-inverting input terminal of the amplifier 1A.

Figure 7B:
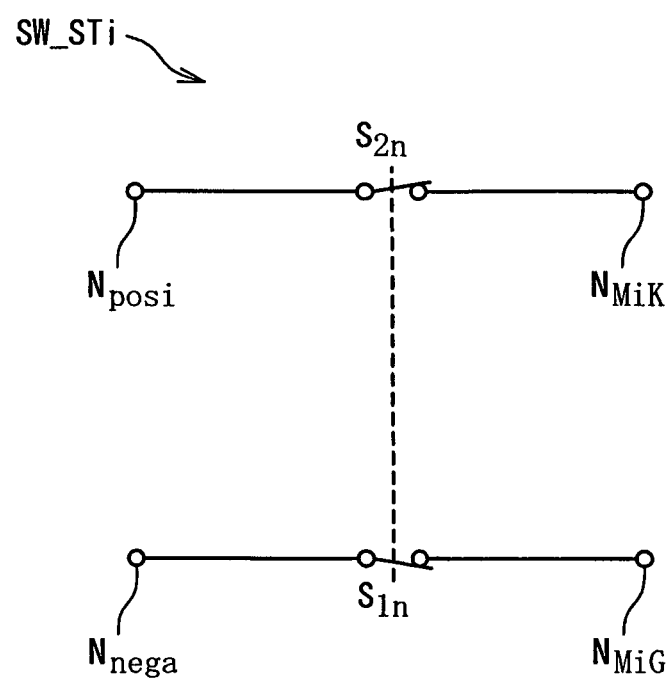
FIG. 7B is a circuit diagram illustrating an exemplary configuration of a straight switch block in the third embodiment.

In this embodiment, the amplifiers 1A and 1B each provide a rail-to-rail operation, and therefore the input/output voltage range of the amplifiers 1A and 2A is from a negative power supply voltage $V_{SS}$ to a positive power supply voltage $V_{DD}$. Accordingly, the amplifier 1A or 2A can be inputted with any of a positive grayscale voltage outputted from the positive side D/A converter and a negative grayscale voltage outputted from the negative side D/A converter. Also, since a cross switch is inserted between the D/A converters and the amplifiers, each amplifier is configured to output both positive and negative drive voltages. Accordingly, the outputs of the amplifiers 1A or 2A are not required to be connected with a cross switch. In this embodiment, as illustrated in FIG. 7B, each of the straight switch blocks SW_ST1 to SW_STn includes only switches that separate the amplifiers 1A and 2A from the even output pad 3 and the odd output pad 4 in collecting charges. Such a configuration also allows outputting a positive drive voltage and a negative drive voltage respectively to the even output pad 3 and the odd output pad 4. The rest of the operation is the same as that in the second embodiment.

(Configuration of Switches)

Figure 8:
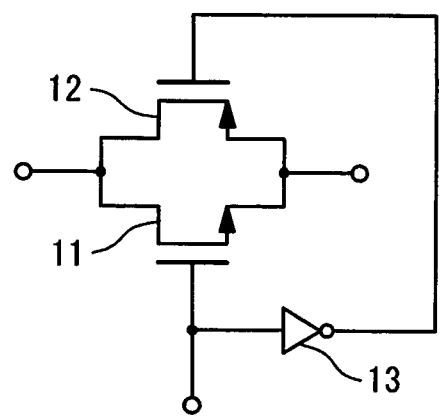
FIG. 8 is a circuit diagram illustrating an exemplary configuration of a transfer gate.

Various types of switches may be used as the switches in the output circuits of the above-described first to third embodiments; an NMOS transistor may be used, or a PMOS transistor may be used instead. Alternatively, a transfer gate may be used, which includes paired NMOS transistor 11 and PMOS transistor 12 having commonly connected sources and drains as shown in FIG. 8. In this case, an inverter 13 is used to supply complementary control signals to the gates of the NMOS transistor 11 and the PMOS transistor 12. This allows simultaneously turning on and off the NMOS transistor 11 and the PMOS transistor 12.

The criterion whether an NMOS transistor, a PMOS transistor, or a transfer gate is used as a switch in the output circuit is desirably determined depending on the voltage applied to the switch. When the voltage applied to the switch is higher than approximately $V_{DD}/2$ where $V_{DD}$ is the positive power supply voltage, for example, a P-channel MOS transistor is preferably used. When the voltage applied to the switch is lower than approximately $V_{DD}/2$, an NMOS transistor is preferably used instead. Also, when the switch is required to be operated within the entire input voltage range from the negative power supply voltage $V_{SS}$ to the positive power supply voltage $V_{DD}$, a transfer gate is preferably used.

Although various embodiments of the present invention are described in the above, the present invention should not be understood as being limited to the above-described embodiments. One skilled in the art would appreciate that various modifications may be made to the present invention. In particular, it is obvious to one skilled in the art that the present invention is applicable not only to the LCD driver, but also to a display driver that drives other types of display panels.

What is claimed is:

1. A display panel driver, comprising:
   first and second amplifiers;
   first to n-th even output nodes, n being an integer of two or more;
   first to n-th odd output nodes;
   first and second output pads connected to data lines of a display panel, respectively;
   first to n-th switch blocks;
   first to n-th even electrostatic protection resistors; and
   first to n-th odd electrostatic protection resistors,
   wherein an i-th switch block out of said first to n-th switch blocks is configured to switch connections between said first and second amplifiers and i-th even and odd electrostatic protection resistors out of said first to n-th even and odd electrostatic protection resistors,
   wherein said first to n-th even electrostatic protection resistors are connected between said first to n-th even output nodes and said first output pad, respectively, and
   wherein said first to n-th odd electrostatic protection resistors are connected between said first to n-th odd output nodes and said second output pad, respectively.

2. The display panel driver according to claim 1, wherein said first amplifier is configured to generate a drive voltage lower than a common voltage fed to an opposite electrode of said display panel;
   wherein said second amplifier is configured to generate a drive voltage higher than said common voltage;
   wherein said i-th switch block includes:
      a first switch connected between said first amplifier and said i-th even output node;
      a second switch connected between said second amplifier and said i-th odd output node;
      a third switch connected between said first amplifier and said i-th odd output node; and
      a fourth switch connected between said second amplifier and said i-th even output node.

3. The display panel driver according to claim 1, further comprising:
   first to n-th charge collecting switch blocks; and
   a common line,
   wherein an i-th charge collecting switch block out of said first to n-th charge collecting switch blocks includes:
      a fifth switch connected between said i-th even output node and said i-th odd output node;
      a sixth switch connected between said i-th odd output node and said common line; and
      a seventh switch connected between said i-th even output node and said common line.

4. The display panel driver according to claim 1, further comprising a cross switch block connected between said first and second amplifiers and first and second D/A converters,
   wherein said first and second amplifiers each provide a rail-to-rail operation,
   wherein said cross switch block is configured to switch connections between outputs of said first and second D/A converters and inputs of said first and second amplifiers, and
   wherein said i-th switch block includes:
      a first switch connected between said first amplifier and said i-th even output node; and
      a second switch connected between said second amplifier and said i-th odd output node.

* * * * *